United States Patent
Lang

(10) Patent No.: US 11,437,699 B2
(45) Date of Patent: Sep. 6, 2022

(54) MULTIPORT MATCHED RF POWER SPLITTER

(71) Applicant: BAE Systems Information and Electronic Systems Integration Inc., Nashua, NH (US)

(72) Inventor: David A. Lang, San Diego, CA (US)

(73) Assignee: BAE Systems Information and Electronic Systems Integration Inc., Nashua, NH (US)

( * ) Notice: Subject to any disclaimer, the term of this patent is extended or adjusted under 35 U.S.C. 154(b) by 162 days.

(21) Appl. No.: 16/935,484

(22) Filed: Jul. 22, 2020

(65) Prior Publication Data

US 2022/0029267 A1 Jan. 27, 2022

(51) Int. Cl.
| | |
|---|---|
| *H01P 5/19* | (2006.01) |
| *H03H 7/38* | (2006.01) |
| *G01R 31/28* | (2006.01) |
| *H03F 3/45* | (2006.01) |
| *G01R 27/28* | (2006.01) |
| *H03H 7/42* | (2006.01) |

(52) U.S. Cl.
CPC ............ *H01P 5/19* (2013.01); *G01R 27/28* (2013.01); *G01R 31/2822* (2013.01); *H03F 3/45475* (2013.01); *H03H 7/38* (2013.01); *H03H 7/42* (2013.01)

(58) Field of Classification Search
CPC ............ H03H 2/00; H03H 7/00; H01P 5/00
See application file for complete search history.

(56) References Cited

U.S. PATENT DOCUMENTS

| | | | |
|---|---|---|---|
| 4,725,792 A | 2/1988 | Lampe | |
| 2013/0147535 A1 | 6/2013 | Hur et al. | |
| 2014/0146866 A1 | 5/2014 | Strachan et al. | |
| 2015/0323577 A1 | 11/2015 | Nadiri et al. | |
| 2016/0099685 A1* | 4/2016 | Babaie | H03F 3/2171 333/100 |
| 2016/0344086 A1* | 11/2016 | Golcuk | H01P 5/185 |
| 2016/0370458 A1* | 12/2016 | Wursthorn | G01R 21/12 |
| 2017/0077892 A1* | 3/2017 | Thorup | H03H 7/48 |
| 2017/0271742 A1* | 9/2017 | Dobric | H01P 5/185 |
| 2019/0094278 A1 | 3/2019 | Lang | |

OTHER PUBLICATIONS

International Search Report, PCT/US21/42180, dated Nov. 10, 2021, 11 pages.
Colman, et al., DC-coupled directional bridge front-end for vector network analyzer receiver in GH-z range. IEICE Electronics Express, vol. 8, No. 11,814-818.

* cited by examiner

*Primary Examiner* — Jermele M Hollington
*Assistant Examiner* — Temilade S Rhodes-Vivour
(74) *Attorney, Agent, or Firm* — Sand, Sebolt & Wernow LPA; Gary McFaline

(57) ABSTRACT

A multiport splitter with a circuit that is less costly, smaller, impedance matched on all ports, provides 9.54 dB isolation between neighboring ports, and is balanced as compared to the current typical implementations. The present disclosure may further provide a single multiport splitter that may be increased to any suitable number of output ports without the need for cascading multiple splitters and/or couplers together in a single device.

20 Claims, 8 Drawing Sheets

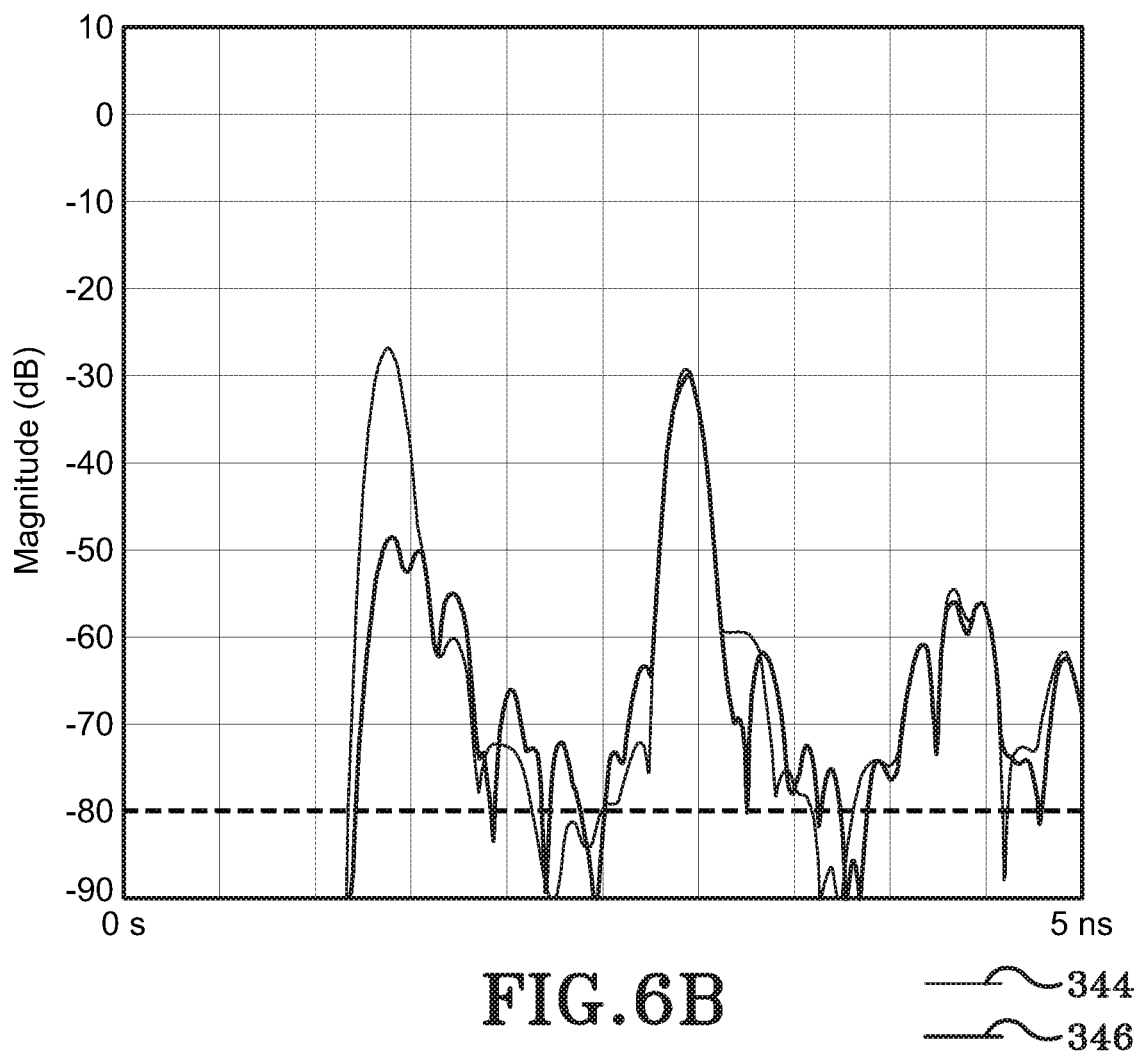

MULTIPORT MATCHED RF POWER SPLITTER

TECHNICAL FIELD

The present disclosure relates to a multiport radio frequency (RF) splitter for use in performing signal monitoring of transmitted and reflected signals, where all ports of the device are matched to a given characteristic impedance. More particularly, in one example, the present disclosure relates to a miniaturized multiport RF splitter for use in performing vector network analysis or distance to fault analysis, having a balanced and matched circuit. Specifically, in another example, the present disclosure relates to a multiport RF splitter with matched ports having a reduced size that may be designed to provide any desired number of matched ports.

BACKGROUND

Vector network analysis (VNA) is a measurement methodology where you transmit a signal into a circuit that separates and routes the incoming signal to a test port and a reference port. You measure both that transmitted energy and reflected energy from a device under test. The transmitted energy is measured on a second port. This is known as a forward path measurement. Typically energy is also transmitted from the second port and you measure both that transmitted energy and reflected energy from a device under test. This is known as a reverse path measurement. Commonly, vector network analyzers utilize one or more splitters and/or one or more directional couplers which are costly and that can likewise be very large.

Current devices utilizing directional couplers are sized proportional to the wavelength of the signal being transmitted into the device. For example, a 1 GHz signal has a wavelength that is 1 foot long. Accordingly, a directional coupler utilized for a 1 GHz signal may be approximately 4 inches long while signals with lower frequencies, tend to increase the size of the coupler. Even high frequency signals still require a fairly large sized directional coupler. For example, a 20 GHz signal may require a coupler that is approximately ½ inch to 1 inch long.

Couplers are typically directional, meaning that the transmitted signal is transmitted out in a first direction from port 1 to port 2. For reflection measurements, if a transmit signal is introduced at port 1, some of the transmitted signal also goes directly to a third port called the coupled port. This is an error signal that is undesirable. A portion of any signal reflected from the output port will also arrive at the coupled port. This is typically a signal of interest. If signals with equal power are injected at the input and output port, the resultant signal at the coupled port associated with the reflected signal will be much larger than the signal associated with the transmitted signal. The ratio in dB of the magnitude of the signal of interest to the magnitude of the error signal at the coupled port is called the directivity. Greater directivity is better. The error signal must be accounted for and is typically removed by using calibration techniques in software.

Current two resistor power splitters, which are often paired with directional couplers, split a signal into two paths and through two output ports. Two resistor power splitters are often used to accurately track and control signal levels. These two resistor power splitters have an input that is matched to a characteristic impedance, for example 50 ohms, while the output ports are not matched to this impedance. For a 50 Ohm splitter the output port impedance is 83 Ohms. This can cause reflections in the system that can create errors in the vector network analysis and results.

One attempt to solve this is to employ a splitter that is matched at both the input and output ports to the characteristic impedance. The Owen's splitter also provides 9.54 dB of isolation between neighboring ports. One example of a matched splitter is what is known as an Owen's splitter, is shown in FIGS. 1 and 2 as prior art, and discussed as such herein. These Owen's splitters are designed with matched ports, but result in only two output ports per splitter. The Owen's splitter can be cascaded to provide multiple outputs (see FIG. 2) if desired, but does not allow for the useful measurement of a reflected signals or signals injected into ports 30, 32, 34, 36.

SUMMARY

The present disclosure addresses these and other issues by providing a multiport splitter with a circuit that is less costly, smaller, impedance matched on all ports, provides 9.54 dB isolation between neighboring ports, and is balanced as compared to the current typical implementations. The present disclosure may further provide a single multiport splitter that may be increased to any suitable number of output ports without the need for cascading multiple splitters and/or couplers together in a single device.

In one aspect, an exemplary embodiment of the present disclosure may provide a signal splitter with a characteristic impedance Z comprising: a signal path having a first arm and a second arm; a first resistor on the first arm having an approximate value of 4Z/3; a first output port extending from the first arm after the first resistor; an additional resistor having an approximate value of 4Z/3 on the first arm; a second output port after the additional resistor on the first arm; a last resistor on the first arm having an approximate value of 2Z, the last resistor connected to a ground; a first resistor on the second arm having an approximate value of 4Z/3; a test port extending from the second arm after the first resistor; an additional resistor having an approximate value of 4Z/3 on the second arm; a third output port after the additional resistor on the second arm; and a last resistor on the second arm having an approximate value of 2Z, the last resistor connected to a ground. This exemplary embodiment or another exemplary embodiment may further provide a subtractor operably connected to the second output port and the third output port. This exemplary embodiment or another exemplary embodiment may further provide wherein the subtractor is a balun. This exemplary embodiment or another exemplary embodiment may further provide wherein the subtractor is a differential amplifier. This exemplary embodiment or another exemplary embodiment may further provide wherein the subtractor is a 180 degree hybrid. This exemplary embodiment or another exemplary embodiment may further provide wherein the first, second, and third ports are matched to the characteristic impedance Z of the splitter. This exemplary embodiment or another exemplary embodiment may further provide wherein the characteristic impedance of the signal source is 50 ohms. This exemplary embodiment or another exemplary embodiment may further provide a device under test having an unknown impedance operably connected to the test port. This exemplary embodiment or another exemplary embodiment may further provide wherein the splitter is operable to determine the impedance of the device under test via the signal outputs of the first, second, and third ports.

In another aspect, an exemplary embodiment of the present disclosure may provide a signal splitter with a characteristic impedance Z comprising: a signal path having a first arm and a second arm; a first resistor on the first arm having an approximate value of 4Z/3; a first output port extending from the first arm after the first resistor; at least one additional resistor having an approximate value of 4Z/3 on the first arm; at least one additional output for each of the at least one additional resistors on the first arm; a last resistor on the first arm having an approximate value of 2Z, the last resistor connected to a ground; a first resistor on the second arm having an approximate value of 4Z/3; an output port extending from the second arm after the first resistor; and a last resistor on the second arm having an approximate value of 2Z, the last resistor connected to a ground. This exemplary embodiment or another exemplary embodiment may further provide at least one additional resistor having an approximate value of 4Z/3 between the first resistor and last resistor on the second arm; and at least one additional output for each of the at least one additional resistors on the second arm. This exemplary embodiment or another exemplary embodiment may further provide at least one subtractor operably connected to at least one of the at least one additional output ports on the first arm and at least one of the at least one of the output ports on the second arm. This exemplary embodiment or another exemplary embodiment may further provide wherein the subtractor is a balun. This exemplary embodiment or another exemplary embodiment may further provide wherein the subtractor is a differential amplifier. This exemplary embodiment or another exemplary embodiment may further provide wherein the subtractor is a 180 degree hybrid. This exemplary embodiment or another exemplary embodiment may further provide wherein all output ports are matched to the characteristic impedance Z of the splitter. This exemplary embodiment or another exemplary embodiment may further provide wherein the characteristic impedance of the signal source is 50 ohms. This exemplary embodiment or another exemplary embodiment may further provide further comprising: a device under test having an unknown impedance operably connected to the test port. This exemplary embodiment or another exemplary embodiment may further provide wherein the splitter is operable to determine the impedance of the device under test via the signal outputs of the first, second, and third ports. This exemplary embodiment or another exemplary embodiment may further provide wherein the device under test is system with a fault and a distance between the splitter and the fault is unknown.

BRIEF DESCRIPTION OF THE SEVERAL VIEWS OF THE DRAWINGS

Sample embodiments of the present disclosure are set forth in the following description, are shown in the drawings and are particularly and distinctly pointed out and set forth in the appended claims.

Similar numbers refer to similar parts throughout the drawings.

DETAILED DESCRIPTION

Figure 1:
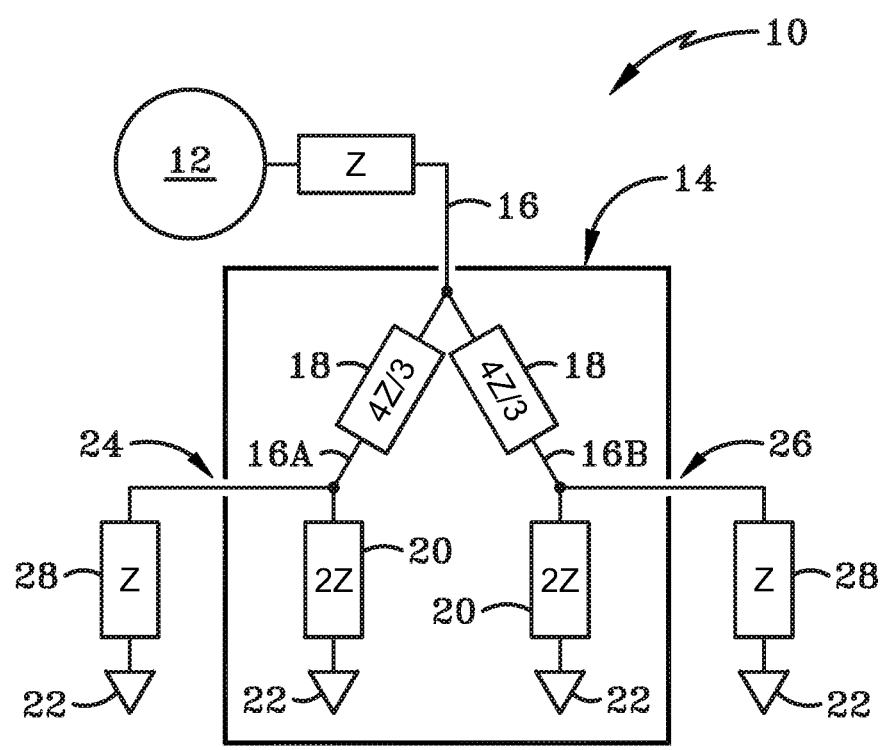
FIG. 1 (FIG. 1) is a schematic view of a PRIOR ART splitter.
Figure 2:
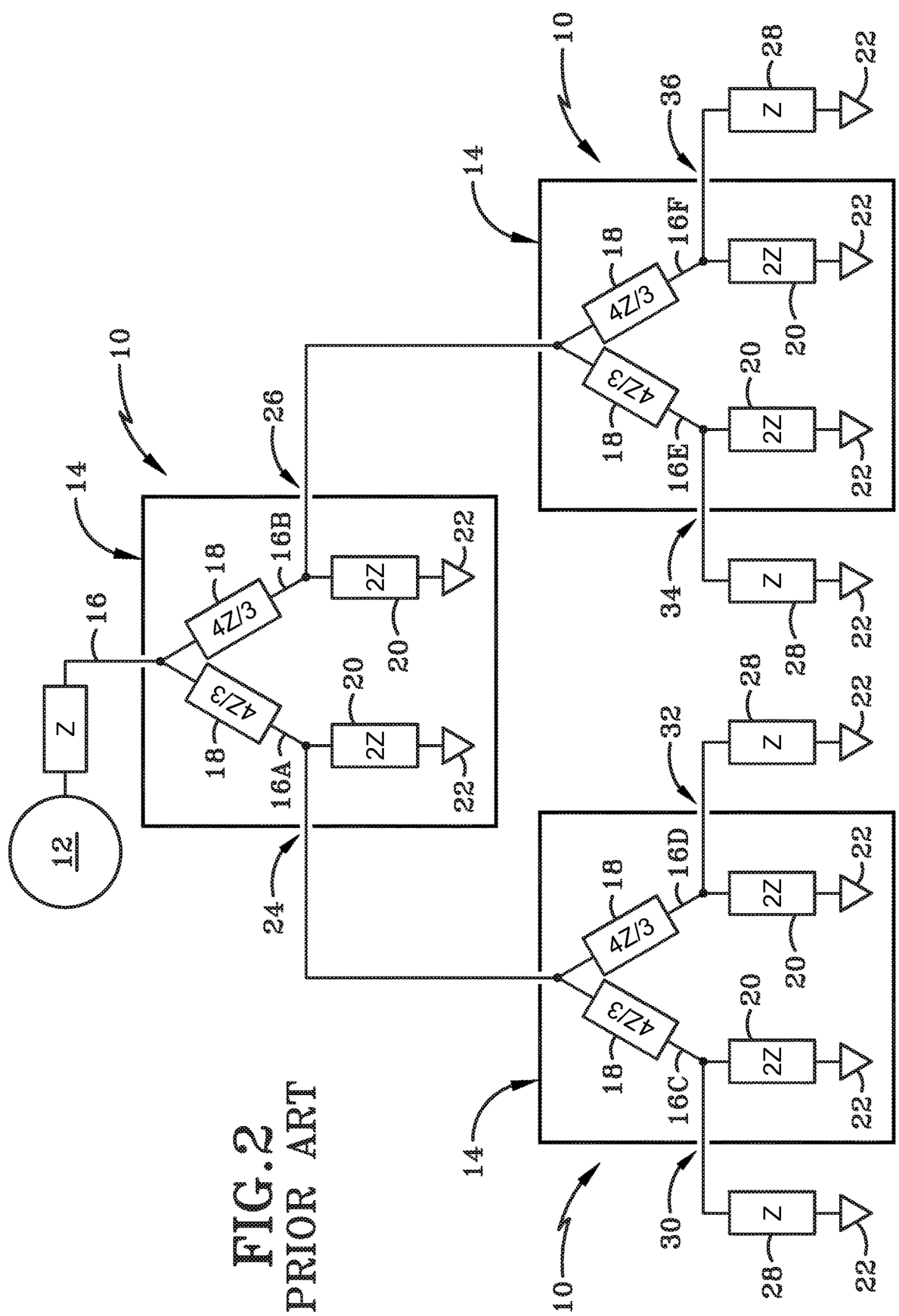
FIG. 2 (FIG. 2) is a schematic view of the PRIOR ART splitter of FIG. 1 shown in a cascaded arrangement.

With reference to FIGS. 1 and 2, a prior art circuit is shown and generally indicated at reference 10. The prior art circuit shown in FIG. 1 contains what is commonly known as an Owen's splitter indicated a reference 14; however, the circuit 10 is presented as a representative example of a prior art circuit 10 and not an exhaustive example thereof.

Prior art circuit 10 may include a source 12, which may operable to generate a signal, such as a radio frequency (RF) signal or the like, into the splitter circuit 14, as discussed below. Circuit 10 may further include a signal path 16 which may be split into a first signal path 16A and a second signal path 16B. Each of first and second signal path 16A and 16B may include a first resistor 18 and a second resistor 20. Each signal path 16A, 16B may likewise include a ground 22.

First signal path 16A may further divide to create a first output port 24 having a terminating resistor 28 thereon with another ground 22 while second signal path 16B may likewise split into an output port, namely second output port 26, having a terminal resistor 28 and a ground 22 thereon.

As mentioned previously, using an Owen's splitter in place of a standard power splitter provides that all output ports, namely first port 24 and second port 26 as shown in FIG. 1, or third through sixth ports 30, 32, 34, and/or 36, as shown in FIG. 2, are matched to the characteristic impedance Z; however, the use of the Owen's splitter typically results in a greater loss than normally occurring in a two resistor power splitter system. Further, utilizing Owen's splitters to replace two resistor power splitters in prior art systems may require cascading multiple splitters together as shown in FIG. 2 to provide additional output ports resulting in an increase cost and size requirement. For example, to provide four output ports, three Owen's splitters are required (as in FIG. 2). For each additional pair of output ports, an additional two Owen's splitters would be required in the cascade.

Figure 3:
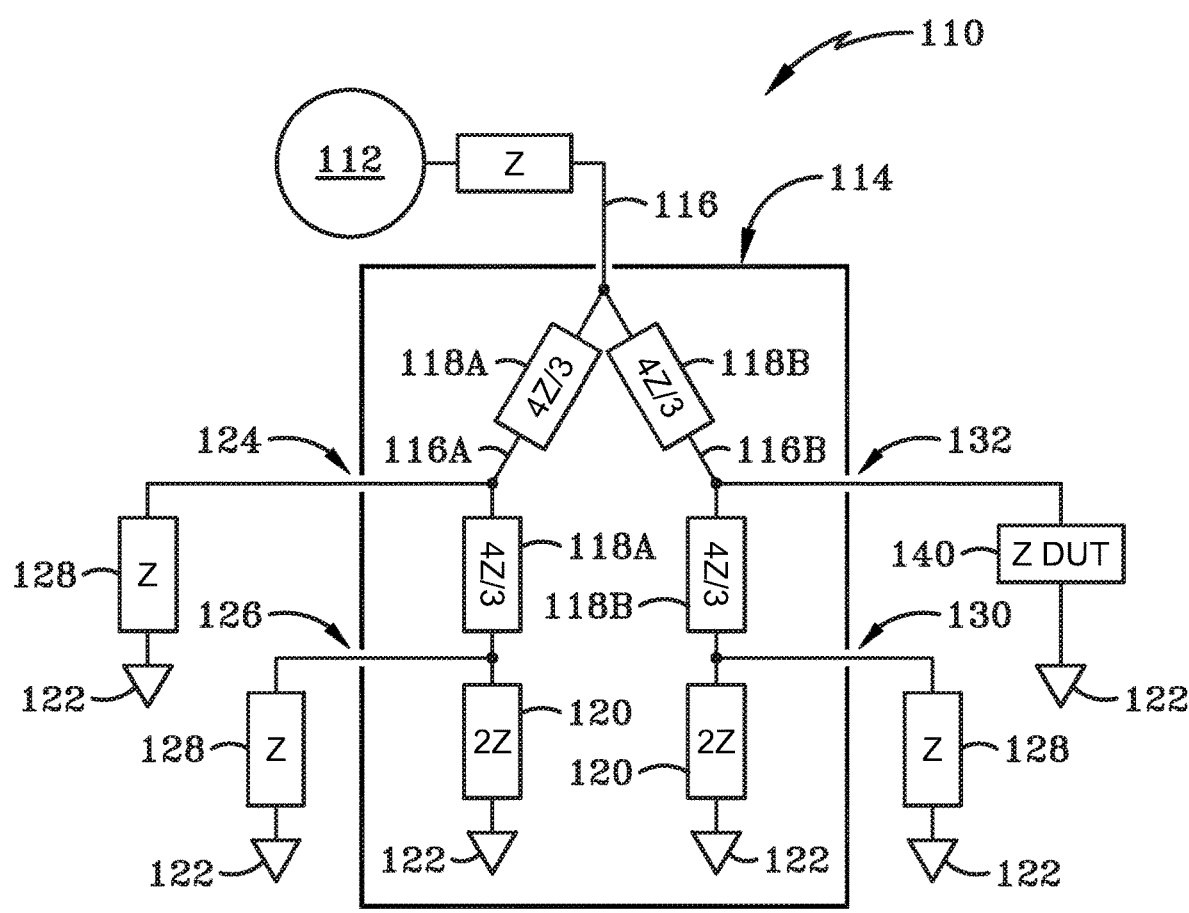
FIG. 3 (FIG. 3) is a schematic view of a splitter according to one aspect of the present disclosure.
Figure 4:
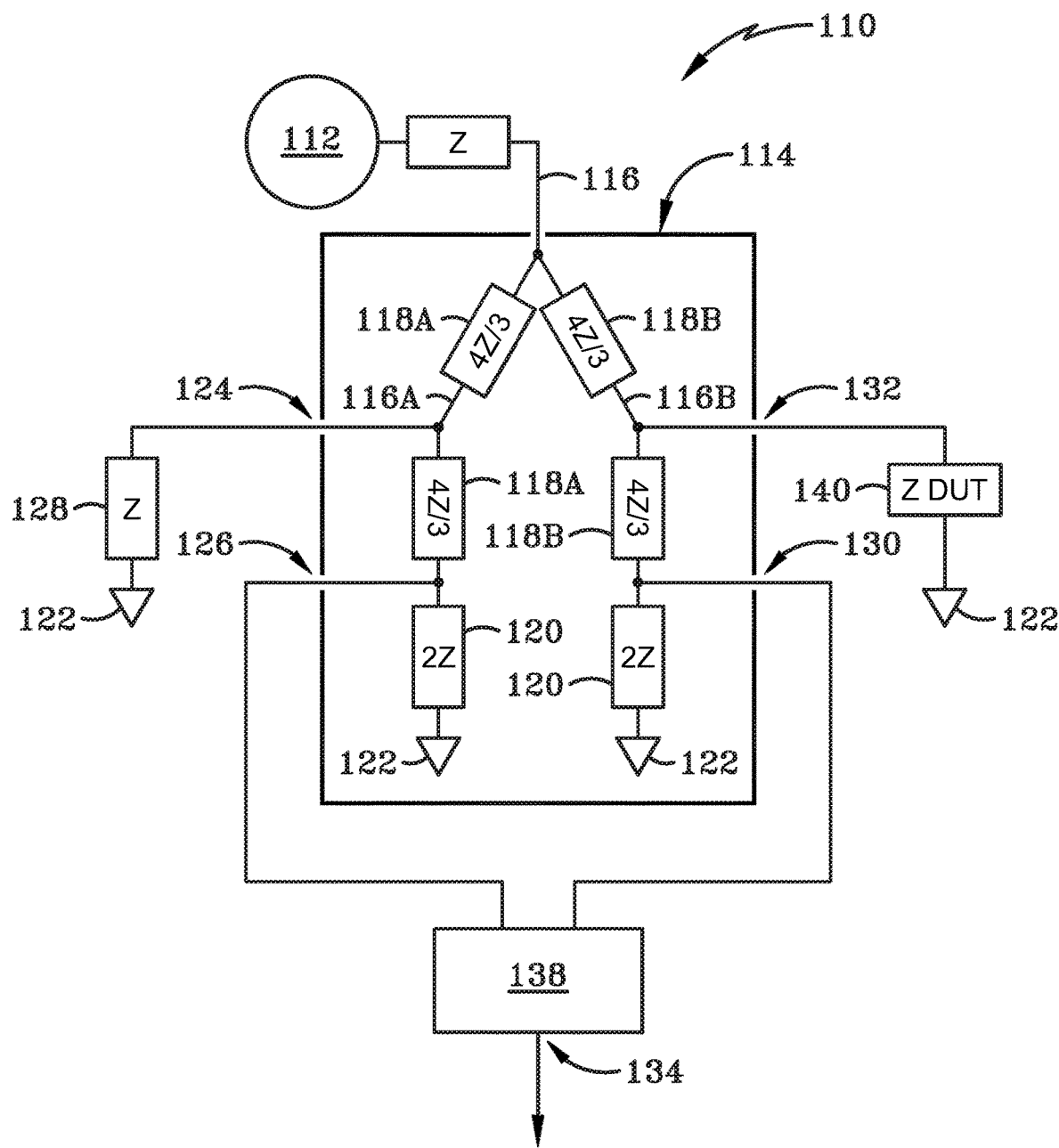
FIG. 4 (FIG. 4) is a schematic view of the splitter of FIG. 3 with an additional subtractor included according to one aspect of the present disclosure.

With reference to FIG. 3 and FIG. 4, a circuit of the present disclosure is shown and generally indicated as circuit 110. Circuit 110 may include a source 112 having an impedance Z which may generate a signal, such as an RF signal or the like, down signal path 116 (defining an input into the splitter 114) where it may further split into a first path arm 116A and a second path arm 116B. Circuit 110 may further include a first resistor pair 118A on first path arm 116A, and a matching first resistor pair 118B on second path arm 116B with one second resistor 120 located on each of first and second arms 116A, 116B. Circuit 110 may further include grounds 122 at every path and/or output as necessary. Likewise, circuit 110 may include one or more third resistors 128 (which may be terminating resistors 128, or may be other devices, as discussed below).

A subtractor may be connected to circuit 110 and may be arranged such that path 116A further branches to provide a first output port 124 and a second output port 126 extending therefrom, with one output port occurring after each of first resistor pair 118A. Second arm 116B of path 116 may likewise provide have a third output port 130 and a fourth output port 132 which may be a test port, as discussed further below. Second port 126 and third port 130 may be connected to a subtractor 138 which may then provide a fifth combined output port 134, as best seen in FIG. 4.

Source 112 may be any device operable to generate an electrical signal, such as a radio frequency (RF) signal or the like, and may further be operable to generate signals spanning multiple frequencies. It is expected that source 112 will be a device with a characteristic impedance Z that is matched to the characteristic impedance of splitter 114 and to each output port of first, second and third ports 124, 126 and 130 to allow for testing of a device (hereinafter referred to as a device under test, or "DUT") 140 connected to test port 132, as discussed further herein. The characteristic impedance Z of the source 112 is typically known and is usually selected for the desired application. For example, most RF and microwave systems have Z=50 Ohms while cable TV uses Z=75 Ohms. Thus, Z is a function of the transmission path physical properties. Once the characteristic impedance Z of the source 112 is known, then all the other resistance values may be computed and/or approximated accordingly, as discussed below.

Source 112 may generate the electrical signal which may travel down path 116 and into circuit 114, as discussed below. It will therefore be understood that where path 116 may further define an input into splitter 114.

Splitter 114, as used herein, is understood to include the individual electronic components, such as first and second resistors 118, 120, grounds 122, and the like. Splitter 114 may further include any transistors, capacitors, inductors, and/or diodes and may include conductive wires or traces through which electric current can flow as dictated by the desired implementation. In utilizing circuit 110 of the present disclosure, the physical circuit layout of circuit 110 may be significantly smaller than a standard two resistor power splitter and coupler combination. For example, a two resistor power splitter and coupler, as used as the current standard, handling a signal of 500 MHz, would have a length of approximately 5-7 inches. The physical circuit trace of circuit 110, arranged as shown in FIG. 3, on the other hand, would have a size of approximately 0.2×0.2 inches.

First resistors 118 (118A and/or 118B) may be any suitable resistor type with any suitable value operable to permit the signal generated by source 112 to follow path 116 down either first arm 116A and/or second arm 1166, according to the desired implementation. Knowing the characteristic impedance of the source 112 then allows the value of the first resistors 118 to be computed. According to one non-limiting example, if a system has a characteristic impedance of 50 Ohms, then we can compute first resistors 118 as having a desired value of 4Z/3, or 66.7 Ohms. The values of first resistors 118 may be approximate in that the desired value of 4Z/3 may be calculated and then first resistors 118 may be provided with an actual value that approximates the desired value. In keeping with the example provided above, where the desired value 4Z/3 is equal to 66.7 Ohms, the first resistors 118 as actually implemented may have a value ranging from less than 60 Ohms to 75 Ohms or more as selected using ordinary engineering principles and as dictated by the desired implementation and resistor availability. According to another aspect, the desired value of first resistors 118 may be calculated as 4Z/3 while first resistors 118 may be actually implemented with commercially available resistors have the closest value (higher or lower) to the desired value. It will therefore be understood that the value of first resistors 118 may be selected to be the closest approximate value to the desired 4Z/3 value.

Second resistors 120 may likewise be any suitable resistor type, as dictated by the desired implementation. Similar to first resistors 118, knowing the characteristic impedance of the source 112 then allows the value of the second resistors 120 to be computed. According to one non-limiting example, if a system has a characteristic impedance of 50 Ohms, then we can compute second resistors 120 to have a desired value of 2Z, or 100 Ohms. Second resistors 120 may be "last" resistors in that they may be the last resistor on each of first and second arms 116A and 116B and may be further connected to the ground 122 on each arm 116A and 116B. As with first resistors 118, the values of second resistors 120 may be approximate in that the desired value of 2Z may be calculated and then second resistors 120 may be provided with an actual value that approximates the desired value. In keeping with the example provided above, where the desired value 2Z is equal to 100 Ohms, the second resistors 120 as actually implemented may have a value ranging from less than 90 Ohms to 110 Ohms or more as selected using ordinary engineering principles and as dictated by the desired implementation and resistor availability. According to another aspect, the desired value of second resistors 120 may be calculated as 2Z while second resistors 120 may be actually implemented with commercially available resistors have the closest value (higher or lower) to the desired value. It will therefore be understood that the value of second resistors 120 may be selected to be the closest approximate value to the desired 2Z value.

Third resistors 128 may be terminating resistors 128, and are equal in value to the characteristic impedance of the system as dictated by the desired implementation. Again, as with first and second resistors 118, 120, knowing the characteristic impedance of the source 112 then allows the value of the second resistors 120 to be computed. According to one non-limiting example, if a system has a characteristic impedance of 50 Ohms then third resistors 128 have a value of 50 Ohms.

It will be understood that the terms first, second, and third, as used herein for resistors 118, 120, and/or 128, are indicative of the type of resistor in that first resistor 118 may be a first resistor type (or first resistor value—such as 4Z/3) and is not to be interpreted as limiting as to the number of each resistor present within circuit 110 and/or 210. For example, with circuit 110 as configured in FIG. 3, there are two occurrences of first resistor 118 (e.g. 118A) on first arm 116A and two occurrences of first resistor 118 (e.g. 118B) on second arm 116B.

First output port 124 and second output port 126 may extend from first arm 116A such that first port 124 may extend from first arm 116A immediately behind the first resistor of first resistor pair 118A and ahead of second resistor of first resistor pair 118B. Second port 126 may then extend from first arm 116A behind the second resistor of first resister pair 1186 and ahead of the second resistor 120 located on first arm 116A. Similarly, third and fourth ports 130 and 132 may extend from second arm 1166 of path 116, except that third port 130 may extend from second arm 1166 after fourth port 132, (test port 132) splits from path 116B. As best seen in FIG. 3, the ports may be numbered in a counterclockwise fashion; however, the "numbering" of ports 124, 126, 130, 132 (and/or 134) may be somewhat arbitrary in that this disclosure numbers them starting with the first port 124 being the first port from first arm 116A; however, it will be understood that these ports may be numbered in any order or fashion provided the desired quantity of ports are present. Similarly, as discussed below, it will be understood that while discussed herein as a fourth port 132 the test port 132 may be any port as chosen and/or dictated by the desired implementation.

Terminating resistors 128 may be any suitable resistor type with any suitable value operable to terminate the signal following path 116. According to another aspect, terminating resistors 128 may be replaced with other devices having a matched impedance Z that may function to terminate the signal traveling down path 116. It will be understood that terminating resistors 128 may vary depending on the specific implementation and use of splitter 114 and the impedance of the system in which it will be used.

As best seen in FIG. 4, subtractor 138 may be any device that may be utilized to combine the signal output from second and third ports 126, 130 such that the subtractor 138 subtracts the signal output of the second port 126 from the signal output of third port 130. As discussed further below, subtractor 138 can facilitate the determination of the impedance of the DUT 140 as it operates to cancel out the signal travelling from source 112 through path 116 and out second and third ports 126 and 130. Subtractor 138 may be any suitable device, including, but not limited to, a 180 degree hybrid, a differential amplifier, a balun, a diode, or the like. The addition of a hardware subtractor substantially improves the directivity of the splitter 114. According to another aspect, subtractor 138 may be two or more downconverters with a subtraction function built into the hardware or alternatively included in processing software. The operation of subtractor 138 is discussed further below with regards to the operation of circuit 110 in general.

DUT 140 may be any device that is desired to be tested using a splitter and/or a circuit, such as circuits 110 and/or 210, and splitters 114 and/or 214. According to one aspect, DUT 140 may be a device operable to reflect a signal back into circuit 110 and/or 210. According to another aspect, DUT 140 may be a device or object with a fault or defect that reflects a signal. According to another aspect, DUT 140 may generate a signal into circuit 110 and/or 210. According to another aspect, DUT 140 may be a pass through device that may allow a signal to be generated outside of the DUT 140 and passed therethrough into circuits 110 and/or 210. According to another aspect, DUT 140 may be system with a fault, for example, a damaged cable or the like.

As with an Owen's splitter (as seen in FIGS. 1 and 2), the circuit 110 of the present disclosure may be a balanced and matched splitter such that each arm 116A, 116B of path 116 may be equal and the output ports 124, 126 and 130 may be matched to the characteristic impedance Z of source 112. Fourth port 132, when used as a test port, may be connected to a DUT 140 which may or may not have a matched impedance of Z. In instances where DUT 140 does have a matched impedance of Z, there will be no reflection of the signal from source 112 and the signal output measured at second port 126 and third port 130 will be equal and those signals would be cancelled out by a subtractor 138. Alternatively, if the impedance of the DUT 140 at the test port 132 is different than the characteristic impedance Z of source 112, then the signal measured at third port 130 will be a combination of the transmitted signal from source 112 and the reflected signal from DUT 140 quantity divided by 3, as discussed further herein.

Figure 5:
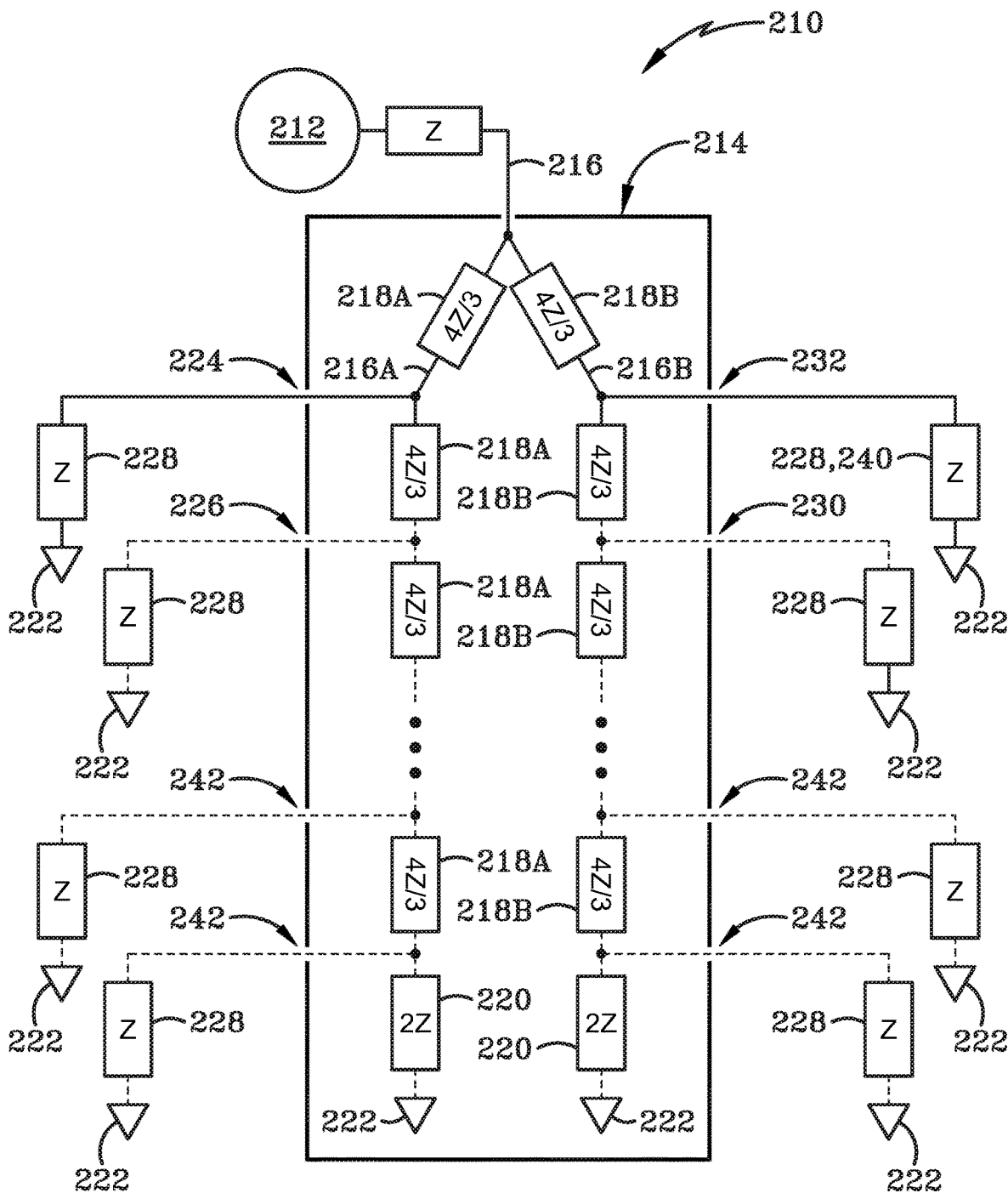
FIG. 5 (FIG. 5) is a schematic view of an alternate embodiment of a splitter according to one aspect of the present disclosure FIG. 6A (FIG. 6A) is graph representing a vector network analysis performed in the frequency domain using a splitter according to one aspect of the present disclosure.

With reference to FIG. 5, an alternate embodiment of a splitter is shown and generally indicated at reference 210. Circuit 210 may be substantially similar or identical to circuit 110 except that it may be expanded to include more than the four ports 124, 126, 130, 132, discussed previously herein. Specifically, splitter 210 may include any number of ports including first output port 224, second output port 226, third output port 230 and fourth output port 232 as well as multiple additional output ports indicated generally at references 242. As shown in FIG. 5, there are four additional output ports 242; however, splitter 210 may be modified to include any desired number of ports according to the desired implementation. Splitter 210 may therefore differ from splitter 110 in that additional first resistors 218A and 218B may be included with an output port between each occurrence of first resistor 218A or 218B along first arm 216A or second arm 216B respectively, as depicted therein. Other than the number of first resistors 218 and/or number of additional ports 242, splitter 210 may likewise include terminal resistors 228 matched to an impedance of Z and/or second resistors 220 and all ports may further have a ground 222 as is the case with splitter 110. According to one aspect, the total number of ports on each path 216A, 216B may be unequal. For example, path 216A may have 2 ports while path 216B may have 3.

It will be understood that the size of circuit 214 may increase with each additional set of first resistors 218A and 218B and/or ports 242 included in splitter 210; however, the overall size of circuit 214 will still remain significantly reduced as compared to prior art systems as discussed herein.

Having thus described the basic elements and components of circuits 110 and 210, the circuits 110, 210 and their functionality will now be described.

Generally speaking, and as discussed previously herein, prior art vector network analyzers typically employ a combination of a two-resistor power splitter and a coupler that have a relatively large size as compared to the splitters 114, 214 of the present disclosure as the size of a coupler increases proportionate to the wavelength of the signal being generated and put through the system. When used with very low frequency signals, such as a 500 MHz signal, these couplers can exceed 4 inches in length increasing both space requirements and cost of such a system. Because splitters 114 and 214 are resistive, their size is independent of frequency. Subtractor 138 may or may not be dependent upon frequency depending on the technology used. For example, a balun that operates from 300 kHz to 67 GHz may be approximately 3.5 inches long. Another balun that operates from 10 MHz to 12 GHz may be less than 0.25" by 0.25"

Typically, current power splitters are a two resistor device with three total ports wherein the two resistors are tied together at one end to create an input port while the other two ends of the two resistors become the two output ports. In this configuration, a two resistor power splitter has equal energy coming out of the two ports. Further, these two resistor power splitters have non-matched ports in that the input port may be matched to a characteristic impedance Z of an energy source, but the output ports are not. This is known to cause reflections from the non-matched ports.

The splitters 114, 214 of the present disclosure have all ports matched to the characteristic impedance Z. Further, splitters 114, 214 incorporate the functionality of a two resistor splitter and a coupler. Additionally, splitters 114, 214 are a fraction of the size of prior art systems in that they are constructed from a series of resistors, such as first resistors 118, 218 and second resistors 120, 220, thus providing a device that has been miniaturized. According to one aspect, using a device having six total resistors as shown in FIG. 3 can reduce the size of the circuit 114, 214 down to be as small as 0.2×0.2 inches while maintaining balance between the right and left side ports and maintaining the matched impedance on every port.

As mentioned previously herein, splitters 114 and 214 may be substantially identical but for the number of ports. Therefore, as discussing the general operation thereof, for purposes of simplicity and clarity, the operation of splitter 114 will be discussed and described in more detail; however, it will be understood that splitter 214 may function substantially similarly or identically to the function of splitter 114. It will be further understood that any methods of operation or operational steps described herein may be equally applicable to both splitter 114 and splitter 214, or to any other splitter having any suitable number of additional ports 242, as described herein. Therefore, it will be further understood that all references here on out to splitter 114 may equally apply to other splitters, including splitter 214, unless specifically stated otherwise.

With reference to FIG. 3 and FIG. 4, in general terms and general operation, circuit 110 may be utilized as a vector network analyzer or distance to fault analyzer in that a source 112 with a known impedance Z may be connected to the input defined by path 116 while a DUT 140 may be connected to the fourth port 132 as discussed herein. The source 112, having a characteristic impedance Z, may then generate a signal which may be an RF signal or the like which may then follow path 116 into splitter 114 where it may be split into first arm 116A and second arm 116B. As the signal moves through the splitter 114, it will split and go out to each port 124, 126, 130, and 132 where it may be terminated (as is the case at ports 124, 126 and 130) or may encounter the DUT 140 at the test port 132. From there, each port may also reflect energy back into splitter 114 which may likewise then travel in all directions both back propagating towards the source 112 as well as continuing to follow paths 116A and 116B to termination. If the DUT 140 has the same characteristic impedance Z as the source, the signals at all ports will be equal and the impedance of the DUT 140 may be determined as being equal to the impedance of the source and the terminating resistors 128. If the impedance of the DUT 140 differs from impedance Z of the source 112, measurements taken at other ports may be utilized to calculate the impedance based on the difference between transmitted energy from source 112 and reflected energy from DUT 140, as discussed further below. Typically, this involves measuring the signal at the first port 124 and the signal either the second port 126 or the third port 130 to determine the amount of transmitted energy as compared to reflected energy as discussed further below. If a subtractor 138 is being used, as discussed below, the relevant measurements are taken at the first port 124 and the fifth port 134.

In instances where second port 126 and third port 130 are connected to a subtractor 138, as shown in FIG. 4, the fifth output port 134 coming from subtractor 138 may provide a measurement wherein the signal from second and third ports 126 and 130 are subtracted from each other. Where DUT 140 has the same characteristic impedance Z as source 112, the subtractor 138, at its most basic level after accounting for noise and error, will cancel out the signals coming from second port 126 and third port 130 entirely. Thus the output coming from fifth port 134 may be zero. Where DUT 140 has a different impedance, utilizing subtractor 138 may allow for an output from fifth port 134 that may then be more representative of the desired measurement as discussed below with reference to FIG. 6B. Essentially, and according to one example, without cancelling out or subtracting out the outputs from second port 126 and third port 130, a large signal reading may be generated that may overwhelm or otherwise mask the signal reading that is desired, thus reducing they dynamic range of the system. Therefore, the use of a subtractor 138 is beneficial to minimize error; however, it is not required as the signals can still be analyzed and the impedance of the DUT 140 can be determined through back end processing.

While described herein as a vector network analyzer or for use with a vector network analyzer, circuit 110 may be utilized for any vector network analysis application, or any other suitable application. Accordingly the DUT 140 may be a device with an unknown impedance or alternatively may be a different device or object for which vector network analysis may be appropriate. Alternatively, circuit 110 may be used for other suitable applications. According to one non-limiting example, the DUT 140 may be a system with a fault, such as a cable or a cable run which is believed to or is known to have physical damage causing a short or another signal disruption, or the like. In such a scenario the reflected signal may be useful in determining or locating such damage to the cable run. This type of testing is known as distance to fault testing. According to another example, circuits 110 and/or 210, or more particularly, splitters 114 and/or 214 may be used as stand-alone splitters in any application where it is desirable to split a signal. Although provided with limited examples, it will be understood that circuits 110 and 210 and splitters 114 and 214 may be utilized in any other suitable vector network analysis application or any other suitable application as dictated by the desired implementation.

With continued reference to FIG. 3 and FIG. 4, it will again be understood that circuits 110 and 210 may be operated substantially similarly or identically and that references to circuit 110, provided herein for clarity, are equally applicable to circuit 210, unless specifically stated otherwise.

Circuit 110 splits a signal from source with a characteristic impedance of Z that is travelling down path 116 into a first arm 116A and second arm 116B. Each arm 116A, 1166 may then divide the signal by a factor of three for each stage. As used herein, each stage may be defined by each occurrence of first resistor 118 and each output port (e.g. ports 124, 126, and/or 130). Splitter 114 may therefore be a resistive structure with M stages on first arm 116A and N stages on second arm 116B and where M and N may be equal to each other. Accordingly, the left side, i.e. first arm 116A, may track the right side, i.e. second arm 116B, where again each port may be matched to the characteristic impedance Z which may be true for all values of M and N (for example where M and N are equal to or greater than two for example as shown in FIG. 5 and splitter 214).

Contrasting splitter 114 with the Owen's splitter 14, as discussed previously herein, provides that the M and N of the Owen's splitter 14 both equal zero while both the M and N of splitter 110 equal one. For splitter 210, the M and N may be variable depending on the number of stages employed therein.

Splitter 114 then results in a circuit 110 that can be used to provide signal tracking of any reflected signal coming from the right or the left hand side, i.e. first or second arms 116A and 116B. This assumes that the opposite side is terminated in the characteristic impedance Z when used with a DUT 140 (which may or may not have an impedance of Z).

The impedance of the DUT 140 may then be determined according to the formulas below. Generally speaking, the impedance of DUT 140 may be determined in that the signal from third port 130 will be a combination of the transmitted signal from source 112 and the reflected signal (R) from DUT 140 divided by 3, while the signal determined at first port 124 will be a reference signal, which is a replica of the signal delivered to the test port 132. The signal at second port 126 will be the replica signal divided by 3.

Knowing these representative signal values at each port, the reflection "R" from the DUT 140 may then be calculated. When configured without a subtractor 138 (as in FIG. 3), the output at third port 130 may be provided by:

$$C=S/9+S/3\times R/3=(S+S\times R)/9 \qquad \text{Eq.1}$$

Where:
C is the output signal at third port 130;
S is the source signal; and
R is the signal reflected back from the DUT 140.

In this configuration, the output from second port 126 and the output from third port 130 can be connected to a receiver and further processed to compute R. Since circuit 114 is balanced, the outputs at second and third ports 126 and 130 track each other (meaning equation 1 is the same for determining the output from either port), thus R can be computed as:

$$(C-B)/B=(S(1+R)/9-S/9)/(S/9)=1+R-1=R \qquad \text{Eq.2}$$

Where:
B is the output signal at second port 126.

When used with a subtractor 138 connected to second and third ports 126 and 130, as discussed herein, the S/9 portion of equations 1 and 2 may be cancelled from the output signals. Thus, the output at fifth port 134 may be provided as:

$$D=(S+S\times R)/9-S/9=S\times R/9 \qquad \text{Eq.3}$$

Where:
D is the output signal at fifth port 134.

If desired, a receiver may be connected to first port 124 to track the input signal amplitude where A=S/3. Then R can be computed as:

$$R=D/(A/3)=(S\times R/9)/(S/9)=R \qquad \text{Eq.4}$$

For either configuration (e.g. with or without subtractor 138), the methods provided in U.S. application Ser. No. 15/717,266, filed Sep. 27, 2017 and titled VECTOR NETWORK ANALYZER ENABLING DEVICE, the disclosure of which is incorporated herein by reference, may be used.

Figure 6A:
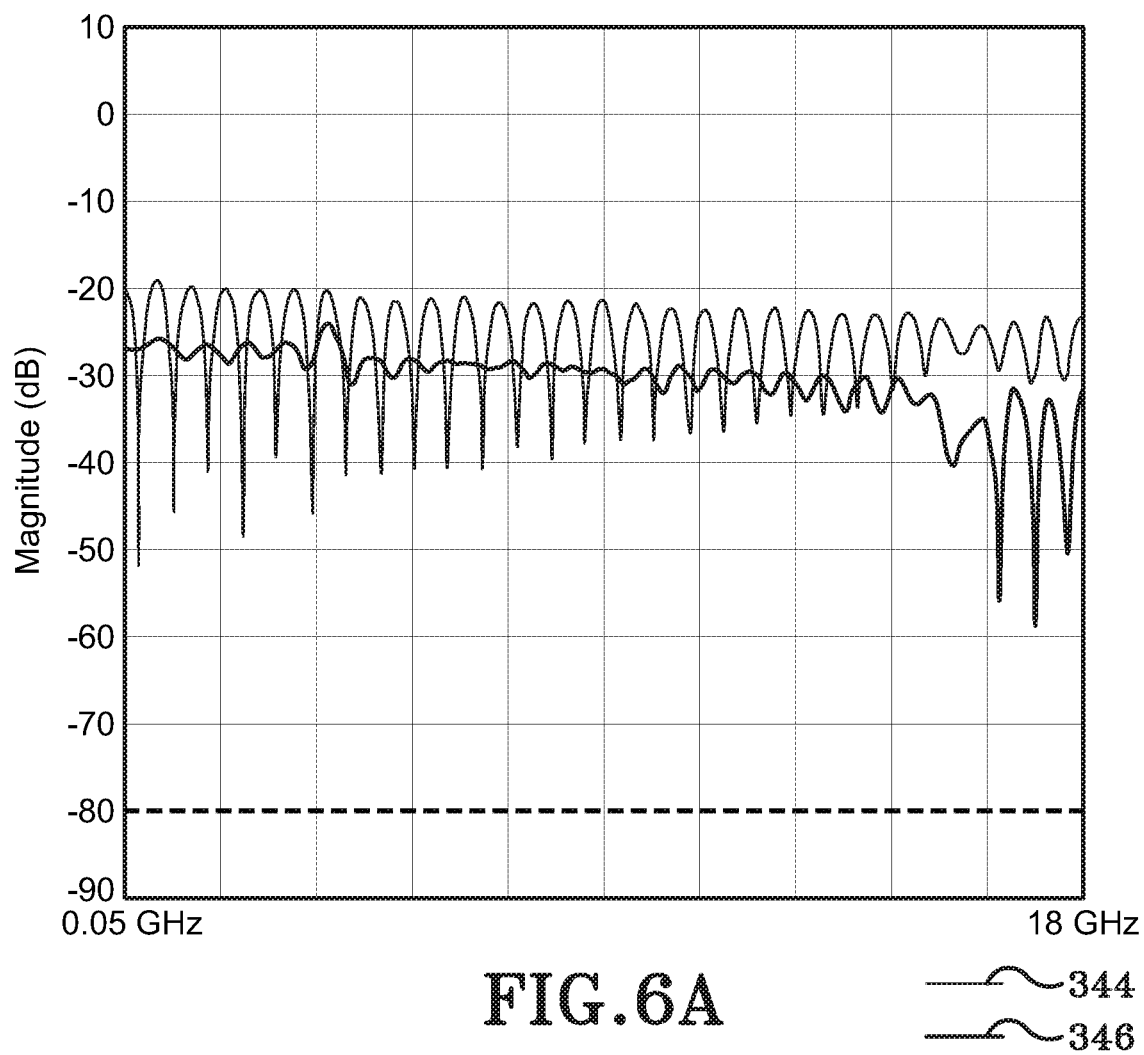
FIG. 6B (FIG. 6B) is graph representing a vector network analysis performed in the time domain using a splitter according to one aspect of the present disclosure.

With reference to FIG. 6A and FIG. 6B, circuit 110 as used with and without subtractor 138 is illustrated in the graphs shown therein. Specifically, with reference to FIG. 6A, a magnitude graph showing the overall output of circuit 110 with second port 126 connected to one side of a balun (as subtractor 138) while the other side of the balun and third port 130 are both terminated at the characteristic impedance Z, or alternatively, where the third port 130 is connected to the other side of the balun from second port. Specifically, and for purposes of this example and the output graph shown in FIG. 6A, the thinner line, indicated at reference 344, represents where second port 126 is connected to the positive side of a balun while the negative side of the balun and third port 130 are terminated at 50 ohms. The thicker line, indicated at reference 346, represents the same configuration but with the positive side of the balun connected to second port 126 and the negative side of the balun connected to third port 130, thus providing the balun as a true subtractor 138 as pictured in FIG. 4. FIG. 6A is shown in the frequency domain beginning with a 0.05 GHz signal frequency and continuing up to an 18 GHz signal frequency, as illustrated by the X axis. The signal magnitude is indicated by the Y axis. It is clearly shown then in FIG. 6A that the overall output signal is more consistent at nearly all frequencies when the balun is connected to both second port 126 and third port 130 as evidenced by the fewer oscillations of line 346. As the signal approaches 18 GHz, some additional error is introduced by internal reflections, as evidenced by the larger deviations of line 346.

With reference to FIG. 6B, the same scenario is presented wherein the thinner line 344 represents a circuit 110 with second port 126 connected to the positive side of a balun and the negative side of the balun and third port 130 both terminated in 50 ohms. Similarly, the thicker line 346 represents the setup with second port 126 connected to the positive side of the balun and third port 130 connected to the negative side of the balun. As seen and indicated in the graph, the X axis represents the time domain starting at zero seconds and ending at 5 nanoseconds whereas the Y axis again represents the signal magnitude. In this example, a signal was sent to a DUT 140 which was a six inch coaxial cable with a short at one end. The end opposite the short was connected to fourth port 132 (i.e. the test port) while the end with the short was a distance of 6 inches away from that connector. The second highest peak is indicative of the reflected signal from the short on the 6 inch cable where both lines 344 and 346 indicate the same signal magnitude. The effect of the balun (i.e. subtractor 138) as used in this case, is better illustrated by the first peak wherein line 344 is higher, representing the signal going directly through the input defined by path 116 from source 112 and then out second port 126 to the balun while the lower peak of line 346 is represented by the signal going through both second port 126 and third port 130 and being cancelled out by the balun before the final signal is measured. This lower magnitude peak helps reduce errors, in that the higher magnitude peak of line 344 is unrelated to the reflected signal of interest. Alternatively, additional back end processing could be utilized to cancel out the error seen in the illustration of line 344. Combining the hardware canceling with software back end processing provides the best performance.

Figure 7:
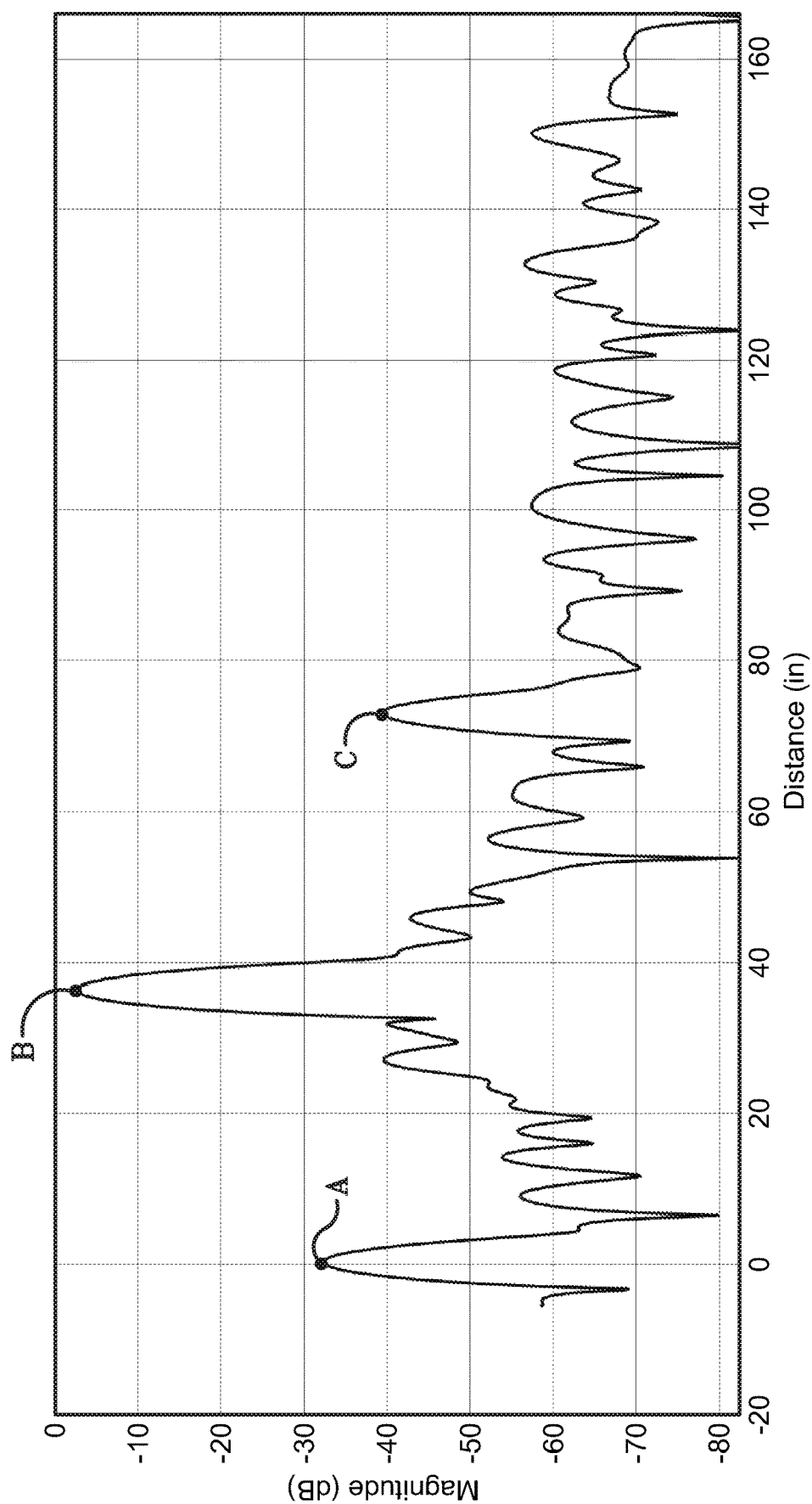
FIG. 7 (FIG. 7) is a graph representing one application of vector network analysis to detect a cable defect location relative to the test port of a vector network analyzer utilizing a splitter according to one aspect of the present disclosure.

With reference to FIG. 7, an exemplary application of vector network analysis is illustrated as used to determine the location of a short in a cable run (i.e. distance to fault testing). Thus, FIG. 7 represents a distance to fault test scenario utilizing circuit 110 with a known transceiver and an off-the-shelf data acquisition system as connected to a DUT 140. In this instance, the DUT 140 used was a 3 foot run of coaxial cable having a short at or near the far end (e.g. the end opposite the connector to the test device/circuit 110). The X axis in FIG. 7 represents distance as measured in inches while the Y axis is signal magnitude in decibels. The peak magnitude indicated at reference point A represents the interface of the test system to the DUT 140, i.e. the signal reflected from the physical connector between the test device including circuit 110 and the DUT 140. A second highest peak is shown and indicated at reference point B which represents a reflection from the short at the end of the cable as the DUT 140, which is indicated at approximately 36.23 inches from the test device interface. A third peak is shown at reference point C which represents a secondary reflection from the short in the DUT 140 back to the interface of the test device then back to the short and back once again. This peak occurs at approximately 73 inches, which is approximately twice the distance to the short and back a single time.

One distinct advantage provided by circuits 110 and/or 210, or more particularly, by splitters 114 and/or 214, not previously discussed herein is the differences in signal loss over prior art systems. Specifically, current systems employing a two resistor power splitter and coupler are large and costly, and are further not balanced and are directional. These systems tend to have an inherent signal loss of approximately 7-8 dB, with approximately 6 dB of loss from the two resistor power splitter, and the remaining loss from the coupler. Using splitters 114 and/or 214, as described herein provides the advantage of a balanced circuit with matched impedance with a significantly smaller footprint.

Thus, utilization of circuits 110 and/or 210, or mare particularly, splitters 114 and/or 214, provide distinct advantages in that these splitters 114, 214 are balanced, have matched impedance at all ports, a reduced footprint, and/or have reduced cost than similar vector network analyzers currently in use.

As mentioned herein, circuits 110 and 210, or more particularly, splitter 114 and/or 214, may be utilized in vector network analysis, however it will be understood that splitters 114 and/or 214 may be likewise employed in any scenario where the splitting and measuring of a signal, such as an RF signal from source 112, or the testing of an external device is desired. It will be further understood that other components not fully described herein may be utilized with splitters 114 and/or 214, including, but not limited to, processors, logics, logic controllers, non-transitory storage media, receivers, transmitters, or the like. It will be likewise understood that splitters 114 and/or 214 may be included in, or adapted for use with, legacy systems and may be integrated into other systems or devices as dictated by the desired implementation.

Various inventive concepts may be embodied as one or more methods, of which an example has been provided. The acts performed as part of the method may be ordered in any suitable way. Accordingly, embodiments may be constructed in which acts are performed in an order different than illustrated, which may include performing some acts simultaneously, even though shown as sequential acts in illustrative embodiments.

While various inventive embodiments have been described and illustrated herein, those of ordinary skill in the art will readily envision a variety of other means and/or structures for performing the function and/or obtaining the results and/or one or more of the advantages described herein, and each of such variations and/or modifications is deemed to be within the scope of the inventive embodiments described herein. More generally, those skilled in the art will readily appreciate that all parameters, dimensions, materials, and configurations described herein are meant to be exemplary and that the actual parameters, dimensions, materials, and/or configurations will depend upon the specific application or applications for which the inventive teachings is/are used. Those skilled in the art will recognize, or be able to ascertain using no more than routine experimentation, many equivalents to the specific inventive embodiments described herein. It is, therefore, to be understood that the foregoing embodiments are presented by way of example only and that, within the scope of the appended claims and equivalents thereto, inventive embodiments may be practiced otherwise than as specifically described and claimed.

Inventive embodiments of the present disclosure are directed to each individual feature, system, article, material, kit, and/or method described herein. In addition, any combination of two or more such features, systems, articles, materials, kits, and/or methods, if such features, systems, articles, materials, kits, and/or methods are not mutually inconsistent, is included within the inventive scope of the present disclosure.

The above-described embodiments can be implemented in any of numerous ways. For example, embodiments of technology disclosed herein may be implemented using hardware, software, or a combination thereof. When implemented in software, the software code or instructions can be executed on any suitable processor or collection of processors, whether provided in a single computer or distributed among multiple computers. Furthermore, the instructions or software code can be stored in at least one non-transitory computer readable storage medium.

Also, a computer or smartphone utilized to execute the software code or instructions via its processors may have one or more input and port devices. These devices can be used, among other things, to present a user interface. Examples of port devices that can be used to provide a user interface include printers or display screens for visual presentation of port and speakers or other sound generating devices for audible presentation of port. Examples of input devices that can be used for a user interface include keyboards, and pointing devices, such as mice, touch pads, and digitizing tablets. As another example, a computer may receive input information through speech recognition or in other audible format.

Such computers or smartphones may be interconnected by one or more networks in any suitable form, including a local area network or a wide area network, such as an enterprise network, and intelligent network (IN) or the Internet. Such networks may be based on any suitable technology and may operate according to any suitable protocol and may include wireless networks, wired networks or fiber optic networks.

The various methods or processes outlined herein may be coded as software/instructions that is executable on one or more processors that employ any one of a variety of operating systems or platforms. Additionally, such software may be written using any of a number of suitable programming languages and/or programming or scripting tools, and also may be compiled as executable machine language code or intermediate code that is executed on a framework or virtual machine.

In this respect, various inventive concepts may be embodied as a computer readable storage medium (or multiple computer readable storage media) (e.g., a computer memory, one or more floppy discs, compact discs, optical discs, magnetic tapes, flash memories, USB flash drives, SD cards, circuit configurations in Field Programmable Gate Arrays or other semiconductor devices, or other non-transitory medium or tangible computer storage medium) encoded with one or more programs that, when executed on one or more computers or other processors, perform methods that implement the various embodiments of the disclosure discussed above. The computer readable medium or media can be transportable, such that the program or programs stored thereon can be loaded onto one or more different computers or other processors to implement various aspects of the present disclosure as discussed above.

The terms "program" or "software" or "instructions" are used herein in a generic sense to refer to any type of computer code or set of computer-executable instructions that can be employed to program a computer or other processor to implement various aspects of embodiments as discussed above. Additionally, it should be appreciated that according to one aspect, one or more computer programs that when executed perform methods of the present disclosure need not reside on a single computer or processor, but may be distributed in a modular fashion amongst a number of different computers or processors to implement various aspects of the present disclosure.

Computer-executable instructions may be in many forms, such as program modules, executed by one or more computers or other devices. Generally, program modules include routines, programs, objects, components, data structures, etc. that perform particular tasks or implement particular abstract data types. Typically the functionality of the program modules may be combined or distributed as desired in various embodiments.

Also, data structures may be stored in computer-readable media in any suitable form. For simplicity of illustration, data structures may be shown to have fields that are related through location in the data structure. Such relationships may likewise be achieved by assigning storage for the fields with locations in a computer-readable medium that convey relationship between the fields. However, any suitable mechanism may be used to establish a relationship between information in fields of a data structure, including through the use of pointers, tags or other mechanisms that establish relationship between data elements.

All definitions, as defined and used herein, should be understood to control over dictionary definitions, definitions in documents incorporated by reference, and/or ordinary meanings of the defined terms.

"Logic", as used herein, includes but is not limited to hardware, firmware, software and/or combinations of each to perform a function(s) or an action(s), and/or to cause a function or action from another logic, method, and/or system. For example, based on a desired application or needs, logic may include a software controlled microprocessor, discrete logic like a processor (e.g., microprocessor), an application specific integrated circuit (ASIC), a programmed logic device, a memory device containing instructions, an electric device having a memory, or the like. Logic may include one or more gates, combinations of gates, or other circuit components. Logic may also be fully embodied as software. Where multiple logics are described, it may be possible to incorporate the multiple logics into one physical logic. Similarly, where a single logic is described, it may be possible to distribute that single logic between multiple physical logics.

Furthermore, the logic(s) presented herein for accomplishing various methods of this system may be directed towards improvements in existing computer-centric or internet-centric technology that may not have previous analog versions. The logic(s) may provide specific functionality directly related to structure that addresses and resolves some problems identified herein. The logic(s) may also provide significantly more advantages to solve these problems by providing an exemplary inventive concept as specific logic structure and concordant functionality of the method and system. Furthermore, the logic(s) may also provide specific computer implemented rules that improve on existing technological processes. The logic(s) provided herein extends beyond merely gathering data, analyzing the information, and displaying the results. Further, portions or all of the present disclosure may rely on underlying equations that are derived from the specific arrangement of the equipment or components as recited herein. Thus, portions of the present disclosure as it relates to the specific arrangement of the components are not directed to abstract ideas. Furthermore, the present disclosure and the appended claims present teachings that involve more than performance of well-understood, routine, and conventional activities previously known to the industry. In some of the method or process of the present disclosure, which may incorporate some aspects of natural phenomenon, the process or method steps are additional features that are new and useful.

The articles "a" and "an," as used herein in the specification and in the claims, unless clearly indicated to the contrary, should be understood to mean "at least one." The phrase "and/or," as used herein in the specification and in the claims (if at all), should be understood to mean "either or both" of the elements so conjoined, i.e., elements that are conjunctively present in some cases and disjunctively present in other cases. Multiple elements listed with "and/or" should be construed in the same fashion, i.e., "one or more" of the elements so conjoined. Other elements may optionally be present other than the elements specifically identified by the "and/or" clause, whether related or unrelated to those elements specifically identified. Thus, as a non-limiting example, a reference to "A and/or B", when used in conjunction with open-ended language such as "comprising" can refer, in one embodiment, to A only (optionally including elements other than B); in another embodiment, to B only (optionally including elements other than A); in yet another embodiment, to both A and B (optionally including other elements); etc. As used herein in the specification and in the claims, "or" should be understood to have the same meaning as "and/or" as defined above. For example, when separating items in a list, "or" or "and/or" shall be interpreted as being inclusive, i.e., the inclusion of at least one, but also including more than one, of a number or list of elements, and, optionally, additional unlisted items. Only terms clearly indicated to the contrary, such as "only one of" or "exactly one of," or, when used in the claims, "consisting of," will refer to the inclusion of exactly one element of a number or list of elements. In general, the term "or" as used herein shall only be interpreted as indicating exclusive alternatives (i.e. "one or the other but not both") when preceded by terms of exclusivity, such as "either," "one of," "only one of," or "exactly one of." "Consisting essentially of," when used in the claims, shall have its ordinary meaning as used in the field of patent law.

As used herein in the specification and in the claims, the phrase "at least one," in reference to a list of one or more elements, should be understood to mean at least one element selected from any one or more of the elements in the list of elements, but not necessarily including at least one of each and every element specifically listed within the list of elements and not excluding any combinations of elements in the list of elements. This definition also allows that elements may optionally be present other than the elements specifically identified within the list of elements to which the phrase "at least one" refers, whether related or unrelated to those elements specifically identified. Thus, as a non-limiting example, "at least one of A and B" (or, equivalently, "at least one of A or B," or, equivalently "at least one of A and/or B") can refer, in one embodiment, to at least one, optionally including more than one, A, with no B present (and optionally including elements other than B); in another embodiment, to at least one, optionally including more than one, B, with no A present (and optionally including elements other than A); in yet another embodiment, to at least one, optionally including more than one, A, and at least one, optionally including more than one, B (and optionally including other elements); etc.

When a feature or element is herein referred to as being "on" another feature or element, it can be directly on the other feature or element or intervening features and/or elements may also be present. In contrast, when a feature or element is referred to as being "directly on" another feature or element, there are no intervening features or elements present. It will also be understood that, when a feature or element is referred to as being "connected", "attached" or "coupled" to another feature or element, it can be directly connected, attached or coupled to the other feature or element or intervening features or elements may be present. In contrast, when a feature or element is referred to as being "directly connected", "directly attached" or "directly coupled" to another feature or element, there are no intervening features or elements present. Although described or shown with respect to one embodiment, the features and elements so described or shown can apply to other embodiments. It will also be appreciated by those of skill in the art that references to a structure or feature that is disposed "adjacent" another feature may have portions that overlap or underlie the adjacent feature.

Spatially relative terms, such as "under", "below", "lower", "over", "upper", "above", "behind", "in front of", and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if a device in the figures is inverted, elements described as "under" or "beneath" other elements or features would then be oriented "over" the other elements or features. Thus, the exemplary term "under" can encompass both an orientation of over and under. The device may be otherwise oriented (rotated 90 degrees or at other orientations) and the spatially relative descriptors used herein interpreted accordingly. Similarly, the terms "upwardly", "downwardly", "vertical", "horizontal", "lateral", "transverse", "longitudinal", and the like are used herein for the purpose of explanation only unless specifically indicated otherwise.

Although the terms "first" and "second" may be used herein to describe various features/elements, these features/elements should not be limited by these terms, unless the context indicates otherwise. These terms may be used to distinguish one feature/element from another feature/element. Thus, a first feature/element discussed herein could be termed a second feature/element, and similarly, a second feature/element discussed herein could be termed a first feature/element without departing from the teachings of the present invention.

An embodiment is an implementation or example of the present disclosure. Reference in the specification to "an embodiment," "one embodiment," "some embodiments," "one particular embodiment," "an exemplary embodiment," or "other embodiments," or the like, means that a particular feature, structure, or characteristic described in connection with the embodiments is included in at least some embodiments, but not necessarily all embodiments, of the invention. The various appearances "an embodiment," "one embodiment," "some embodiments," "one particular embodiment," "an exemplary embodiment," or "other embodiments," or the like, are not necessarily all referring to the same embodiments.

If this specification states a component, feature, structure, or characteristic "may", "might", or "could" be included, that particular component, feature, structure, or characteristic is not required to be included. If the specification or claim refers to "a" or "an" element, that does not mean there is only one of the element. If the specification or claims refer to "an additional" element, that does not preclude there being more than one of the additional element.

As used herein in the specification and claims, including as used in the examples and unless otherwise expressly specified, all numbers may be read as if prefaced by the word "about" or "approximately," even if the term does not expressly appear. The phrase "about" or "approximately" may be used when describing magnitude and/or position to indicate that the value and/or position described is within a reasonable expected range of values and/or positions. For example, a numeric value may have a value that is +/−0.1% of the stated value (or range of values), +/−1% of the stated value (or range of values), +/−2% of the stated value (or range of values), +/−5% of the stated value (or range of values), +/−10% of the stated value (or range of values), etc. Any numerical range recited herein is intended to include all sub-ranges subsumed therein.

Additionally, the method of performing the present disclosure may occur in a sequence different than those described herein. Accordingly, no sequence of the method should be read as a limitation unless explicitly stated. It is recognizable that performing some of the steps of the method in a different order could achieve a similar result.

In the claims, as well as in the specification above, all transitional phrases such as "comprising," "including," "carrying," "having," "containing," "involving," "holding," "composed of," and the like are to be understood to be open-ended, i.e., to mean including but not limited to. Only the transitional phrases "consisting of" and "consisting essentially of" shall be closed or semi-closed transitional phrases, respectively, as set forth in the United States Patent Office Manual of Patent Examining Procedures.

In the foregoing description, certain terms have been used for brevity, clearness, and understanding. No unnecessary limitations are to be implied therefrom beyond the requirement of the prior art because such terms are used for descriptive purposes and are intended to be broadly construed.

Moreover, the description and illustration of various embodiments of the disclosure are examples and the disclosure is not limited to the exact details shown or described.

The invention claimed is:

1. A signal splitter with a characteristic impedance Z comprising:
   a signal path having a first arm and a second arm;
   a first resistor on the first arm having an approximate value of 4Z/3;
   a first output port extending from the first arm after the first resistor;
   an additional resistor having an approximate value of 4Z/3 on the first arm;
   a second output port after the additional resistor on the first arm;
   a last resistor on the first arm having an approximate value of 2Z, the last resistor connected to a ground;
   a first resistor on the second arm having an approximate value of 4Z/3;
   a test port extending from the second arm after the first resistor;
   an additional resistor having an approximate value of 4Z/3 on the second arm;
   a third output port after the additional resistor on the second arm; and a last resistor on the second arm having an approximate value of 2Z, the last resistor connected to a ground.

2. The signal splitter of claim 1 further comprising:
a subtractor operably connected to the second output port and the third output port.

3. The signal splitter of claim 2 wherein the subtractor is a balun.

4. The signal splitter of claim 2 wherein the subtractor is a differential amplifier.

5. The signal splitter of claim 2 wherein the subtractor is a 180 degree hybrid.

6. The signal splitter of claim 2 wherein the first, second, and third ports are matched to the characteristic impedance Z of the splitter.

7. The signal splitter of claim 6 wherein the characteristic impedance of the signal source is 50 ohms.

8. The signal splitter of claim 2 further comprising:
a device under test having an unknown impedance operably connected to the test port.

9. The signal splitter of claim 8 wherein the splitter is operable to determine the impedance of the device under test via the signal outputs of the first, second, and third ports.

10. A signal splitter with a characteristic impedance Z comprising:
a signal path having a first arm and a second arm;
a first resistor on the first arm having an approximate value of 4Z/3;
a first output port extending from the first arm after the first resistor;
at least one additional resistor having an approximate value of 4Z/3 on the first arm;
at least one additional output for each of the at least one additional resistors on the first arm;
a last resistor on the first arm having an approximate value of 2Z, the last resistor connected to a ground;
a first resistor on the second arm having an approximate value of 4Z/3;
an output port extending from the second arm after the first resistor; and
a last resistor on the second arm having an approximate value of 2Z, the last resistor connected to a ground.

11. The signal splitter of claim 10 further comprising:
at least one additional resistor having an approximate value of 4Z/3 between the first resistor and last resistor on the second arm; and
at least one additional output for each of the at least one additional resistors on the second arm.

12. The signal splitter of claim 11 further comprising:
at least one subtractor operably connected to at least one of the at least one additional output ports on the first arm and at least one of the at least one of the output ports on the second arm.

13. The signal splitter of claim 12 wherein the subtractor is a balun.

14. The signal splitter of claim 12 wherein the subtractor is a differential amplifier.

15. The signal splitter of claim 12 wherein the subtractor is a 180 degree hybrid.

16. The signal splitter of claim 12 wherein all output ports are matched to the characteristic impedance Z of the splitter.

17. The signal splitter of claim 16 wherein the characteristic impedance of the signal source is 50 ohms.

18. The signal splitter of claim 12 further comprising:
a device under test having an unknown impedance operably connected to the test port.

19. The signal splitter of claim 18 wherein the splitter is operable to determine the impedance of the device under test via the signal outputs of the first, second, and third ports.

20. The signal splitter of claim 18 wherein the device under test is system with a fault and a distance between the splitter and the fault is unknown.

* * * * *